United States Patent
Singhal et al.

(10) Patent No.: US 12,199,576 B2
(45) Date of Patent: Jan. 14, 2025

(54) GAIN REDUCTION TECHNIQUES FOR RADIO-FREQUENCY AMPLIFIERS

(71) Applicant: Apple Inc., Cupertino, CA (US)

(72) Inventors: Nitesh Singhal, Santa Clara, CA (US); Mark G. Forbes, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 451 days.

(21) Appl. No.: 17/580,128

(22) Filed: Jan. 20, 2022

(65) Prior Publication Data
US 2023/0231522 A1    Jul. 20, 2023

(51) Int. Cl.
| | |
|---|---|
| *H04B 1/04* | (2006.01) |
| *H03F 1/14* | (2006.01) |
| *H03F 3/19* | (2006.01) |
| *H03G 3/30* | (2006.01) |
| *H04B 1/40* | (2015.01) |
| *H04B 1/401* | (2015.01) |

(52) U.S. Cl.
CPC ............ *H03F 3/19* (2013.01); *H03G 3/3036* (2013.01); *H04B 1/04* (2013.01); *H03F 2200/451* (2013.01); *H03G 2201/103* (2013.01); *H03G 2201/307* (2013.01); *H04B 2001/0416* (2013.01); *H04B 1/40* (2013.01)

(58) Field of Classification Search
CPC ... H03F 3/19; H03F 2200/451; H03G 3/3036; H03G 2201/103; H03G 2201/307; H04B 1/04; H04B 1/40; H04B 2001/0416
See application file for complete search history.

(56) References Cited

U.S. PATENT DOCUMENTS

| | | | |
|---|---|---|---|
| 7,256,646 B2 | 8/2007 | Eid et al. | |
| 7,301,396 B1 | 11/2007 | Johnson et al. | |
| 7,443,241 B2 * | 10/2008 | Fong .................... | H03G 1/0029 330/254 |
| 10,903,804 B2 | 1/2021 | Dandu et al. | |
| 2005/0242884 A1 | 11/2005 | Anand | |
| 2005/0248396 A1 | 11/2005 | Caresosa et al. | |
| 2006/0071712 A1 * | 4/2006 | Lee .................... | H03G 1/0088 330/254 |
| 2007/0120603 A1 | 5/2007 | Chang et al. | |

(Continued)

*Primary Examiner* — Yuwen Pan
*Assistant Examiner* — Daniel Christian Paglia
(74) *Attorney, Agent, or Firm* — Treyz Law Group; Jason Tsai (57) ABSTRACT

An electronic device may include wireless circuitry with a processor, a transceiver, an antenna, and a front-end module coupled between the transceiver and the antenna. The front-end module may include one or more radio-frequency amplifiers for amplifying a radio-frequency signal. The radio-frequency amplifier may include input transistors cross-coupled with capacitance neutralization transistors and/or coupled to cascode transistors. One or more n-type gain adjustment transistors may be coupled to source terminals of the capacitance neutralization transistors. One or more p-type gain adjustment transistors may be coupled to source terminals of the cascode transistors. One or more processors in the electronic device can selectively activate one or more of the gain adjustment transistors to reduce the gain of the radio-frequency amplifier without degrading noise performance and without altering the in-band frequency response of the radio-frequency amplifier.

21 Claims, 8 Drawing Sheets

(56) References Cited

U.S. PATENT DOCUMENTS

| | | | |
|---|---|---|---|
| 2007/0164826 A1* | 7/2007 | Chang | H03F 1/223 |
| | | | 330/311 |
| 2015/0270806 A1 | 9/2015 | Wagh et al. | |
| 2016/0036393 A1* | 2/2016 | Lin | H03F 1/3211 |
| | | | 330/295 |
| 2016/0190996 A1* | 6/2016 | Searle | H03F 3/211 |
| | | | 330/295 |
| 2017/0244368 A1 | 8/2017 | Blum | |
| 2020/0336104 A1 | 10/2020 | Schober et al. | |

* cited by examiner

GAIN REDUCTION TECHNIQUES FOR RADIO-FREQUENCY AMPLIFIERS

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted or received by an antenna are often fed through one or more radio-frequency amplifiers, which are configured to amplify low power signals to higher power signals more suitable for transmission through the air over long distances or more suitable for detection at the receiver. It can be challenging to design a satisfactory radio-frequency amplifier for an electronic device.

SUMMARY

An electronic device may include wireless communications circuitry. The wireless communications circuitry may include one or more processors, a transceiver for transmitting and receiving radio-frequency signals, and one or more radio-frequency amplifiers configured to amplify the radio-frequency signals. A radio-frequency amplifier may be operable in multiple gain modes such as a high gain mode and a low gain mode.

An aspect of the disclosure provides a radio-frequency amplifier that includes: a first input transistor having a first source-drain terminal coupled to a ground power supply line, a second source-drain terminal coupled to a first amplifier output terminal, and a gate terminal configured to receive a radio-frequency signal; a second input transistor having a first source-drain terminal coupled to the ground power supply line, a second source-drain terminal coupled to a second amplifier output terminal, and a gate terminal configured to receive the radio-frequency signal; a first capacitance neutralization transistor having a first source-drain terminal coupled to the second source-drain terminal of the first input transistor, a second source-drain terminal, and a gate terminal coupled to the gate terminal of the second input transistor; a second capacitance neutralization transistor having a first source-drain terminal coupled to the second source-drain terminal of the second input transistor, a second source-drain terminal, and a gate terminal coupled to the gate terminal of the first input transistor; and at least one gain adjustment transistors coupled to the second source-drain terminal of the first capacitance neutralization transistor.

The radio-frequency amplifier can further include: a first resistor having a first terminal coupled to the second source-drain terminal of the first capacitance neutralization transistor and having a second terminal coupled to the ground power supply line; and a second resistor having a first terminal coupled to the second source-drain terminal of the second capacitance neutralization transistor and having a second terminal coupled to the ground power supply line.

The one or more gain adjustment transistors can be n-type transistors with variable sizing.

The radio-frequency amplifier may also include: a first cascode transistor having a first source-drain terminal coupled to the second source-drain terminal of the first input transistor, a second source-drain terminal coupled to the first amplifier output terminal, and a gate terminal configured to receive a bias voltage; and a second cascode transistor having a first source-drain terminal coupled to the second source-drain terminal of the second input transistor, a second source-drain terminal coupled to the second amplifier output terminal, and a gate terminal configured to receive the bias voltage. The radio-frequency amplifier may include a p-type gain adjustment transistor having a first source-drain terminal coupled to the first source-drain terminal of the first cascode transistor and having a second source-drain terminal coupled to the second source-drain terminal of the second cascode transistor. The n-type and/or p-type gain adjustment transistors can have gate terminals configured to receive a gain control voltage from one or more processors in the electronic device. The gain adjustment transistors can be deactivated when operating the radio-frequency amplifier in the high gain mode and can be activated when operating the radio-frequency amplifier in one or more low(er) gain mode.

DETAILED DESCRIPTION

An electronic device may be provided with wireless communications circuitry. The wireless communications circuitry may include a transceiver circuit for transmitting and receiving radio-frequency signals, one or more radio-frequency amplifiers for amplifying the radio-frequency signals, and an antenna for radiating and receiving the radio-frequency signals. The radio-frequency amplifier may be operable in at least a nominal (high) gain mode and one or more low gain modes across a wide range of frequency bands. The term "radio-frequency amplifier" referred to herein may be a power amplifier, a low noise amplifier, or other amplifying circuits in the wireless communications circuitry.

The radio-frequency amplifier can include input transistors and capacitance neutralization transistors cross-coupled with the input transistors. The capacitance neutralization transistors can be coupled in series with large resistors to ensure zero current density through the capacitance neutralization transistors during the nominal (high) gain mode.

The radio-frequency (RF) amplifier can further include one or more gain adjustment switches that are selectively activated and deactivated to operate the radio-frequency amplifier in the low gain mode(s) and the high gain mode. In one exemplary embodiment, the gain adjustment switches can be coupled in parallel with the large resistors. During the high gain mode, the gain adjustment switches are turned off. During the low gain mode, one or more processors in the electronic device can turn on the gain adjustment switches to allow current that is out-of-phase with the current flowing through the input transistors to flow through the capacitance neutralization transistors, which reduces the gain of the radio-frequency amplifier. Configured and operated in this way, a wide range of gain attenuation can be achieved with fine resolution without negatively impacting the noise figure and frequency response between the high and low gain modes.

Figure 1:
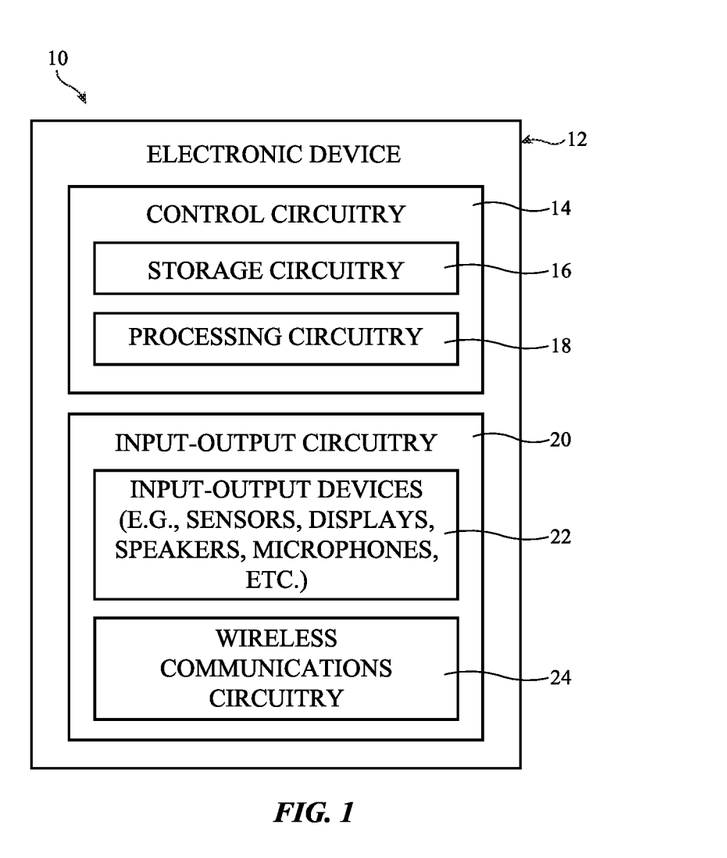
FIG. 1 is a diagram of an illustrative electronic device having wireless communications circuitry in accordance with some embodiments.

FIG. 1 is a diagram of an electronic device such as electronic device 10 that can be provided with such wireless transmission circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application processors, application specific integrated circuits, central processing units (CPUs), general purpose processors, or other types of processors. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
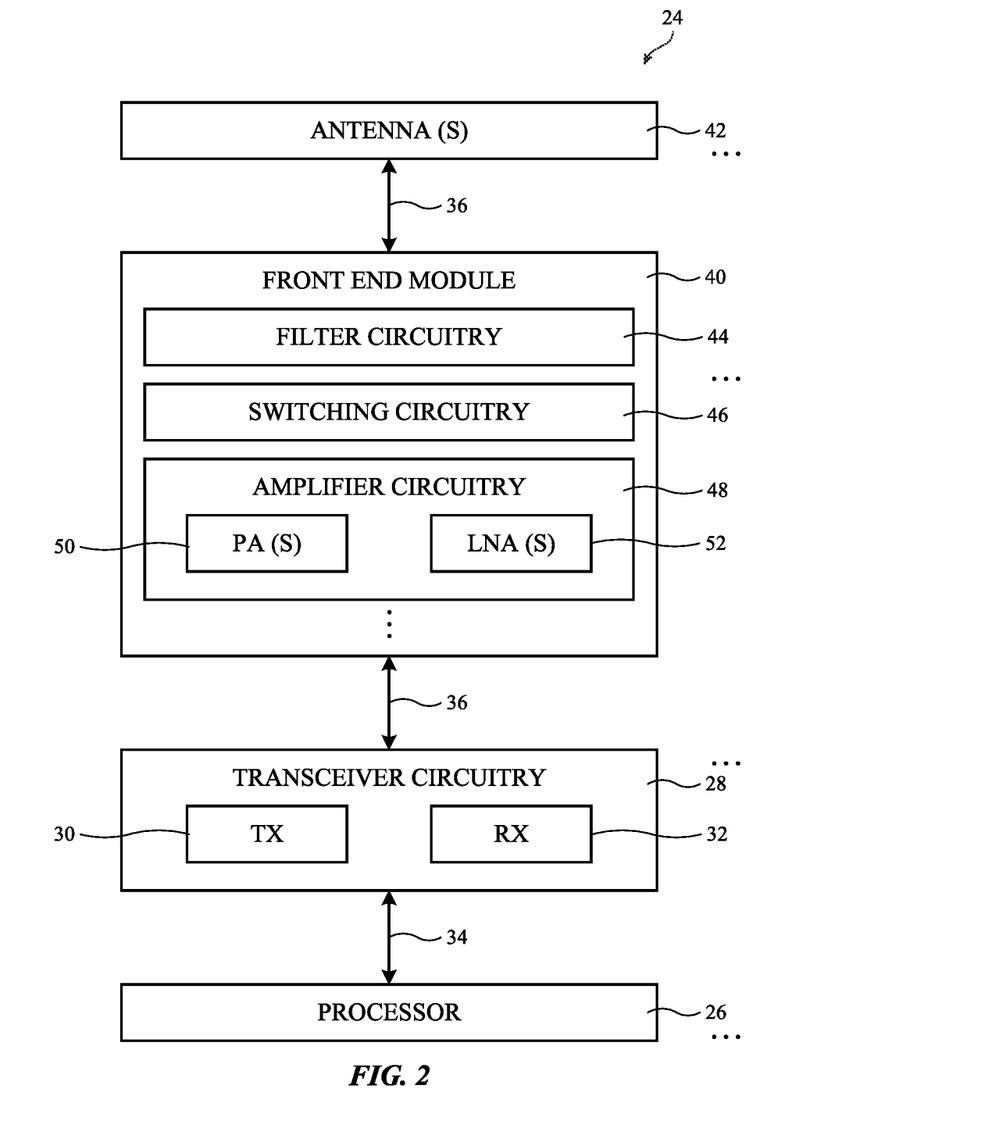
FIG. 2 is a diagram of illustrative wireless communications circuitry having amplifier circuitry in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio-frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path and one or more low noise amplifier (LNA) circuits 52 in the receive (downlink) path. A radio-frequency amplifier (e.g., power amplifier 50, low noise amplifier 52, or other amplifying circuits within wireless communications circuitry 24) may be configured to amplify a radio-frequency signal without changing the signal shape, format, or modulation. A radio-frequency amplifier may, for example, be used to provide 10 dB of gain, 20 dB of gain, 10-20 dB of gain, less than 20 dB of gain, more than 20 dB of gain, or other suitable amounts of gain.

Figure 3:
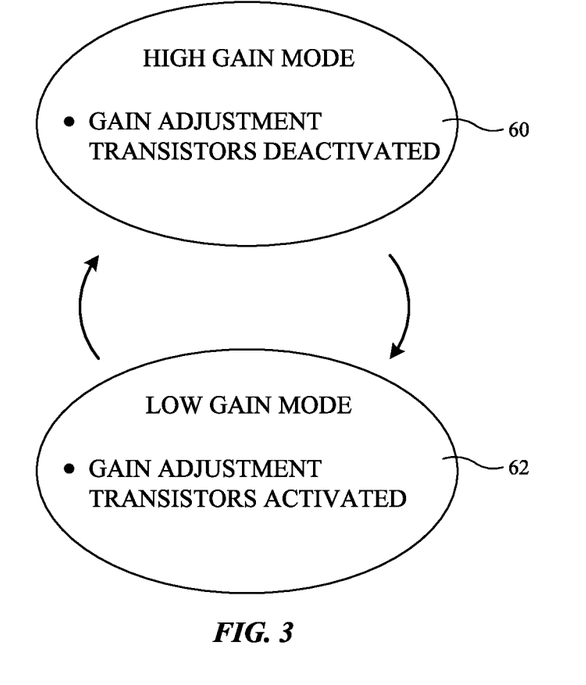
FIG. 3 is a state diagram showing how a radio-frequency amplifier can be operable in a high gain mode and a low gain mode in accordance with some embodiments.

A radio-frequency amplifier (sometimes referred to as amplifier circuitry) may have an adjustable gain. FIG. 3 is a state diagram showing how a radio-frequency amplifier can be operable in at least a high gain mode 60 and a low gain mode 62. When operated in high gain mode 60, the radio-frequency amplifier may be configured to provide a first amount of gain. The RF amplifier may include gain adjustment switches (e.g., gain adjustment transistors) that are deactivated during the high gain mode. When operated in the low gain mode 62, the gain adjustment transistors may be activated so that the radio-frequency amplifier is configured to provide a second amount of gain that is less than the first amount of gain. The second amount of gain can be 2 dB less than the first amount of gain, 4 dB less than the first amount of gain 2-10 dB less than the first amount of gain, 10-20 dB less than the first amount of gain, 20-50 dB less than the first amount of gain, or other suitable attenuations of gain.

The example of FIG. 3 showing only two different gain modes is merely illustrative. If desired, an radio-frequency amplifier can be operated in a high (nominal) gain mode and one or more low gain modes having gains that are reduced relative to the high gain mode (e.g., the RF amplifier can have at least three different gain modes, four or more different gain modes, 5-10 different gain modes, 10-100 different gain modes, etc.). It can be challenging to design a satisfactory radio-frequency amplifier with multiple gain modes for an electronic device.

Figure 4:
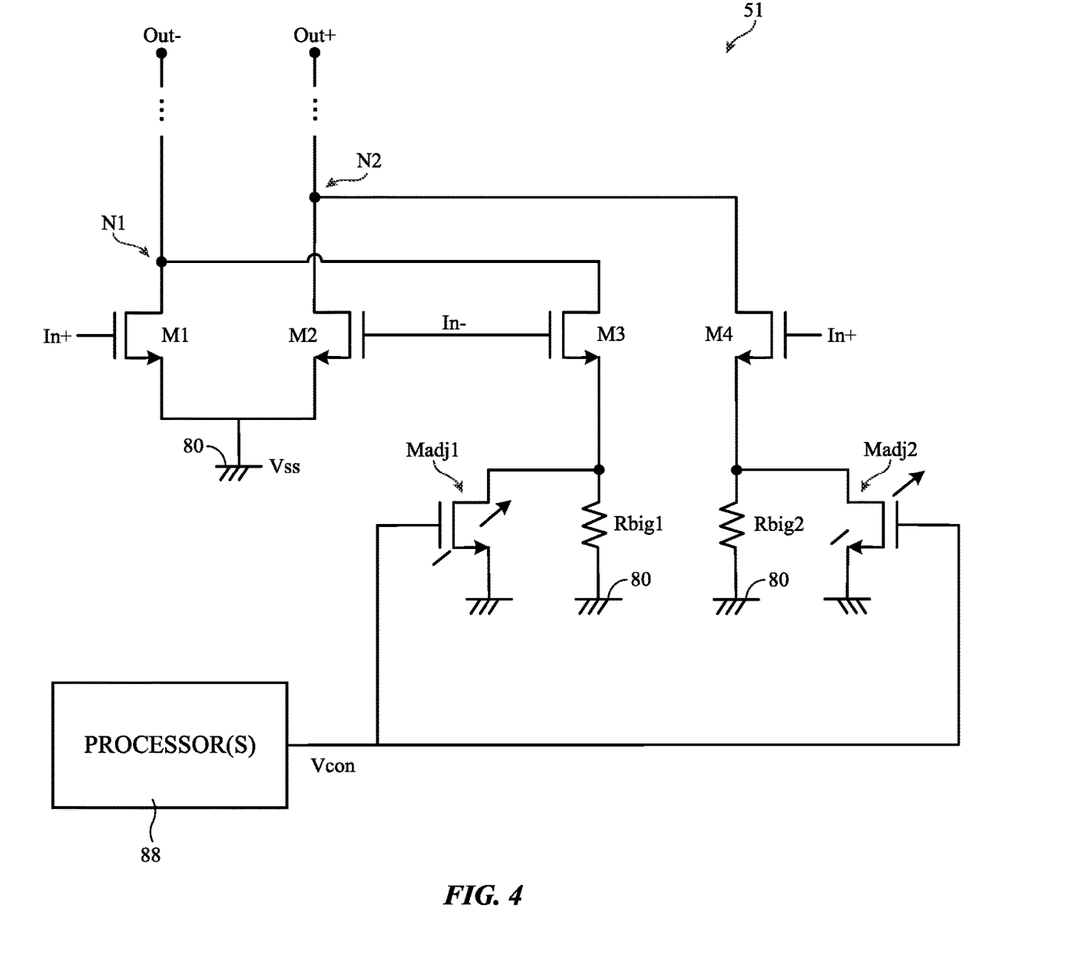
FIG. 4 is a circuit diagram of illustrative radio-frequency amplifier circuitry having gain adjustment switches in accordance with some embodiments.

FIG. 4 is a circuit diagram showing one illustrative implementation of a radio-frequency amplifier 51. Amplifier 51 may represent power amplifier 50, low noise amplifier 52, or other amplifier circuitry within wireless communications circuitry 24. As shown in FIG. 4, amplifier 51 may include input transistors M1 and M2. Transistors M1 and M2 may be n-type (n-channel) transistors such as n-type metal-oxide-semiconductor (NMOS) devices. Transistor M1 may have a source terminal coupled to a ground power supply line 80 (e.g., a ground line on which ground power supply voltage Vss is provided), a drain terminal, and a gate terminal coupled to a positive input terminal In+ of amplifier 51. Transistor M2 may have a source terminal coupled to ground power supply line 80, a drain terminal, and a gate terminal coupled to a negative input terminal In− of amplifier 51. Input terminals In+ and In− serve collectively as the differential input port of amplifier 51, so transistors M1 and M2 are sometimes referred to as input transistors.

The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa). The drain terminal of the first input transistor M1 may be directly or indirectly (via one or more intervening components) coupled to a negative output terminal Out− of amplifier 51. The drain terminal of the second input transistor M2 may be directly or indirectly (via one or more intervening components) coupled to a positive output terminal Out+ of amplifier 51. Output terminals Out+ and Out−, sometimes referred to as amplifier output terminals, serve collectively as the differential output port of amplifier 51.

Amplifier 51 may further include n-type transistors M3 and M4 (e.g., NMOS devices). Transistor M3 may have a source terminal coupled to ground power supply line 80 via a first resistor Rbig1, a gate terminal coupled to negative input terminal In−, and a drain terminal cross-coupled to the drain terminal of input transistor M1 (at node N1). Transistor M4 may have a source terminal coupled to ground power supply line 80 via a second resistor Rbig2, a gate terminal coupled to positive input terminal In+, and a drain terminal cross-coupled to the drain terminal of input transistor M2 (at node N2). Configured in this way, transistors M3 and M4 are sometimes considered to be cross-coupled with input transistors M1 and M2 can be used to neutralize the gate-to-drain parasitic capacitance of input transistors M1 and M2, which improves the overall gain of amplifier 51. Thus, transistors M3 and M4 are sometimes referred to as parasitic capacitance neutralization transistors or capacitance cancellation transistors.

Resistors Rbig1 and Rbig2 that are connected to the source terminals of the capacitance neutralization transistors M3 and M4 are sometimes referred to as source resistors. Source resistors Rbig1 and Rbig2 should have relatively large resistance values so that in the nominal use case (e.g., in the high gain mode), all of the current flowing into nodes N1 and N2 will only flow into the input transistors M1 and M2, respectively, without flowing into neutralization transistors M3 and M4. Resistors Rbig1 and Rbig2 can each be at least ten thousand ohms, at least a thousand ohms, ten thousand to a hundred thousand ohms, or even millions of ohms. Thus, the use of capacitance neutralization transistors M3 and M4 with zero current density can be used to achieve high gain.

Conventional radio-frequency amplifiers with such type of differential pair topology achieves gain reduction by reducing the current density through the input transistors M1 and M2. Reducing the amount of current flowing through the input transistors, however, degrades the noise performance of the amplifier while also potentially altering the in-band frequency response of that amplifier.

In accordance with an embodiment, radio-frequency amplifier 51 of FIG. 4 may be provided with gain adjustment switches that can be used to adjust the gain of amplifier 51 without degrading the noise performance and while maintaining the in-band frequency response of amplifier 51. As shown in FIG. 4, a first gain adjustment switch Madj1 (e.g., an n-type transistor) may have a source terminal coupled to ground line 80, a drain terminal coupled to the source terminal of capacitance neutralization transistor M3, and a gate terminal configured to receive control signal Vcon. Gain adjustment transistor Madj1 is therefore coupled in parallel with source resistor Rbig1. A second gain adjustment switch Madj2 (e.g., an n-type transistor) may have a source terminal coupled to ground line 80, a drain terminal coupled to the source terminal of capacitance neutralization transistor M4, and a gate terminal configured to receive control signal Vcon. Gain adjustment transistor Madj2 is therefore coupled in parallel with source resistor Rbig2.

Gain adjustment transistors Madj1 and Madj2 can be controlled by signal Vcon generated by one or more processors 88. Processor(s) 88 may, for example, represent one or more microprocessors, microcontrollers, digital signal processors, host processors, baseband processors, application processors, application specific integrated circuits, central processing units (CPUs), general purpose processors, and/or other types of processors. Processor 88 may sometimes be considered part of processor circuitry 18 shown in FIG. 1, processor 26 of the type shown in FIG. 2, or other types of processors.

During high gain mode, processor 88 may deassert signal Vcon (e.g., drive Vcon to a low voltage level) to deactivate gain adjustment transistors Madj1 and Madj2. While transistors Madj1 and Madj2 are deactivated (turned off), there is zero current density through capacitance neutralization transistors M3 and M4 due to the large source resistance of Rbig1 and Rbig2.

During low gain mode, processor 88 may assert signal Vcon (e.g., drive Vcon to a high voltage level) to activate gain adjustment transistors Madj1 and Madj2. Activating (turning on) transistors Madj1 and Madj2 allows capacitance neutralization transistors M3 and M4 to now carry DC current (e.g., current from node N1 can now flow through transistors M3 and Madj2, whereas current from node N2 can now flow through transistors M4 and Madj2). Signal Vcon is therefore sometimes referred to as a gain control voltage or a gain adjustment voltage.

In particular, the current flowing through the capacitance neutralization transistors M3 and M4 will flow in the opposite phase (e.g., 180° phase offset) as the current flowing through the input transistors M1 and M2. In other words, the current through transistor M3 will be out-of-phase with the current flowing through transistor M1, whereas the current through transistor M4 will be out-of-phase with the current flowing through transistor M2. Turning on gain adjustment transistors Madj1 and Madj2 to allow out-of-phase current to flow through capacitance neutralization transistors M3 and M4 achieves gain reduction for radio-frequency amplifier 51 while potentially canceling out multiplicative large signal noise such as bias noise without altering the frequency response between the high and low gain modes. Attaining gain reduction in this way can also improve noise characteristics in the low gain mode(s).

Figure 5:
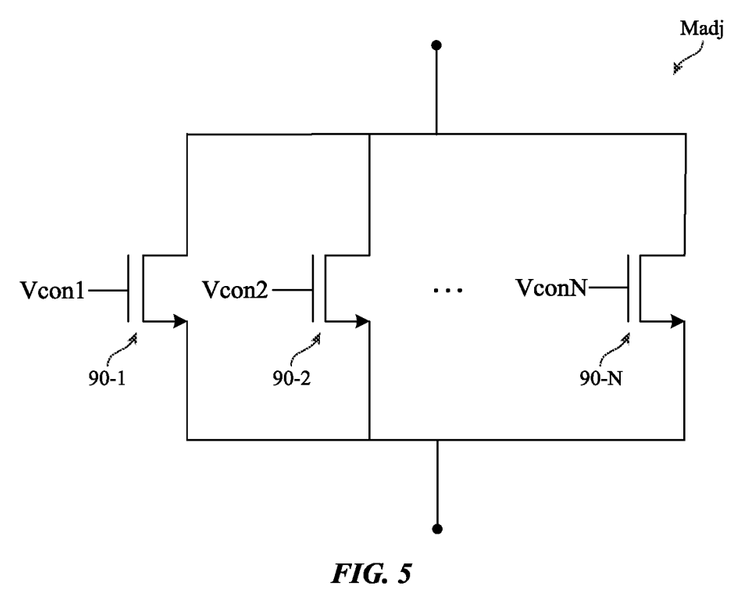
FIG. 5 is a circuit diagram of an illustrative gain adjustment switch with variable sizing in accordance with some embodiments.

The sizing of gain adjustment transistors Madj1 and Madj2 can be fixed or variable. Very fine resolution in gain attenuation can be achieved by making the size of transistors Madj1 and Madj2 variable. FIG. 5 is a circuit diagram showing one suitable implementation of transistor Madj with variable/adjustable sizing. Transistor Madj may represent transistor Madj1 and/or Madj2 of FIG. 4. As shown in FIG. 5, gain adjustment transistor Madj may include multiple transistors that are selectively switched into use using respective gate control voltages. For example, a first transistor 90-1 can be selectively activated by asserting a first gate control signal Vcon1; a second transistor 90-2 can be selectively activated by asserting a second gate control signal Vcon2; . . . ; and an $N^{th}$ transistor 90-N can be selectively activated by asserting gate control signal VconN. The size of transistors 90 can be the same or can be different.

Control voltages Vcon1-VconN can be asserted (e.g., driven high) and deasserted (e.g., driven low) by processor 88 (see FIG. 4) to set the overall drive strength or sizing of transistor Madj. Increasing the size of gain adjustment transistor Madj can increase the amount of gain reduction and thus provide even more gain attenuation. If desired, a large range of gain attenuation may be achieved by setting the magnitude of the current through the capacitance neutralization transistors equal to the magnitude of the current through the input transistors (but still opposite in phase) in the lowest gain mode.

Figure 6:
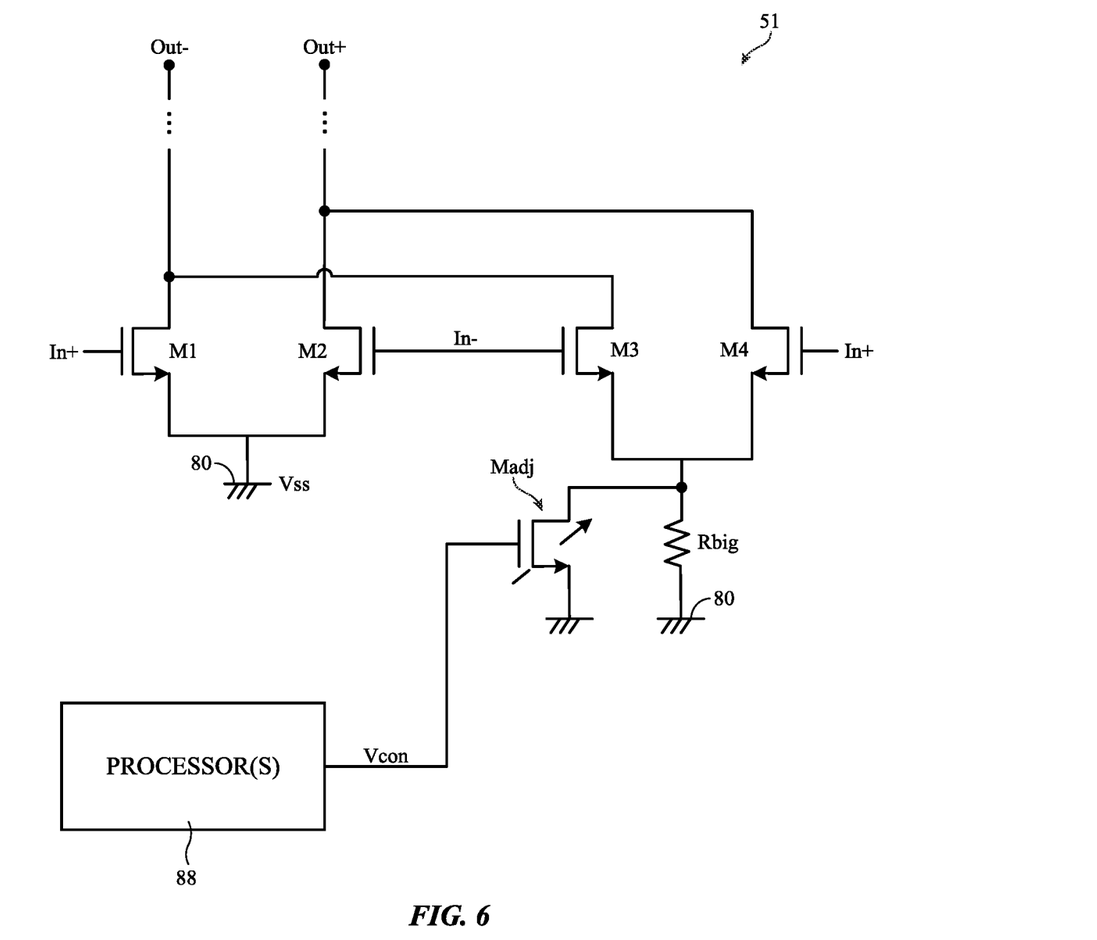
FIG. 6 is a circuit diagram of illustrative radio-frequency amplifier circuitry having a single gain adjustment switch component in accordance with some embodiments.

The example of FIG. 4 in which capacitance neutralization transistors M3 and M4 are coupled to different source resistors Rbig1 and Rbig2 is merely illustrative. FIG. 6 illustrates another embodiment of amplifier 51 having capacitance neutralization transistors M3 and M4 coupled to a single source resistor Rbig. As shown in FIG. 6, source resistor Rbig has a first terminal that is coupled to the source terminals of transistors M3 and M4 and a second terminal coupled to ground line 80. Resistor Rbig can be at least ten thousand ohms, at least a thousand ohms, ten thousand to a hundred thousand ohms, or even millions of ohms to ensure that the current density in capacitance neutralization transistors M3 and M4 is zero in the nominal high gain use case.

In the example of FIG. 6, amplifier 51 includes a single gain adjustment switch Madj (e.g., an n-type transistor) that is coupled in parallel with source resistor Rbig. Gain adjustment transistor Madj can be controlled by signal Vcon generated by one or more processors 88. During high gain mode, processor 88 may deassert signal Vcon (e.g., drive Vcon to a low voltage level) to deactivate gain adjustment transistor Madj. While transistor Madj is deactivated (turned off), there is zero current density through capacitance neutralization transistors M3 and M4 due to the large source resistance of Rbig.

During low gain mode, processor 88 may assert signal Vcon (e.g., drive Vcon to a high voltage level) to activate gain adjustment transistor Madj. Activating (turning on) transistor Madj allows capacitance neutralization transistors M3 and M4 to now carry DC current. In particular, the current flowing through the capacitance neutralization transistors M3 and M4 will flow in the opposite phase or out-of-phase with respect to the current flowing through the input transistors M1 and M2. Turning on gain adjustment transistor Madj to allow out-of-phase current to flow through capacitance neutralization transistors M3 and M4 achieves gain reduction for amplifier 51 while potentially canceling out multiplicative large signal noise such as bias noise without altering the frequency response between the high and low gain modes. The sizing of gain adjustment transistor Madj can be fixed or variable (see, e.g., FIG. 5).

Figure 7:
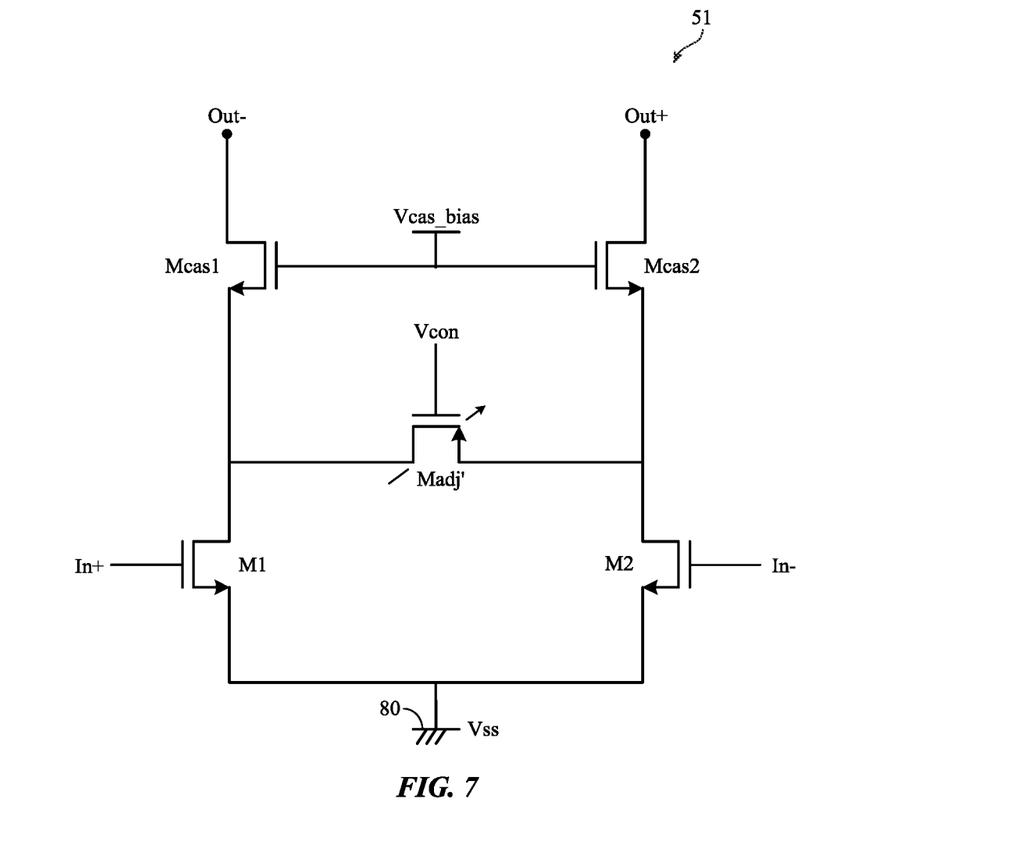
FIG. 7 is a circuit diagram of illustrative radio-frequency amplifier circuitry having a p-type gain adjustment switch in accordance with some embodiments.

The examples of FIGS. 4 and 6 in which at least one gain adjustment switch is coupled to the source terminals of the capacitance neutralization transistors are merely illustrative. FIG. 7 illustrates another embodiment of amplifier 51 having cascode transistors and a gain adjustment switch coupled to the source terminals of the cascode transistors Mcas1 and Mcas2. As shown in FIG. 7, radio-frequency amplifier 51 may include input transistors M1 and M2, cascode transistors Mcas1 and Mcas2, and gain adjustment transistor Madj'. Transistors M1 and M2 may be n-type (n-channel) transistors such as NMOS devices. Transistor M1 may have a source terminal coupled to ground power supply line 80, a drain terminal, and a gate terminal coupled to a positive input terminal In+. Transistor M2 may have a source terminal coupled to ground power supply line 80, a drain terminal, and a gate terminal coupled to a negative input terminal In−.

Transistor Mcas1 may have a source terminal coupled to the drain terminal of input transistor M1, a gate terminal configured to receive a cascode bias voltage Vcas_bias, and a drain terminal coupled to negative output terminal Out−. Transistor Mcas2 may have a source terminal coupled to the drain terminal of input transistor M2, a gate terminal configured to receive cascode bias voltage Vcas_bias, and a drain terminal coupled to positive output terminal Out+. Bias voltage Vcas_bias may have some intermediate voltage level between ground voltage level Vss and a positive power supply voltage Vdd. If desired, voltage Vcas_bias may also be equal to positive power supply voltage Vdd.

Transistors M3 and M4 interposed between the drain terminals of the input transistors and the differential output port in this way are sometimes referred to collectively as cascode transistors. A cascode transistor (stage) can be defined as an amplifier stage with an amplifying transistor that has its gate terminal coupled to a common (fixed) voltage source (e.g., Vcas_bias). The cascode transistor stage with Mcas1 and Mcas2 may enable the use of higher supply voltages (since the high voltage stress at high output power is distributed between the cascode transistors and the input transistors), increase the output impedance of radio-frequency amplifier 51, reduce the transformation loss in the output matching network, improve the overall efficiency of amplifier 51. In general, amplifier 51 can include other load components coupled to the input or output terminals of amplifier 51.

Gain adjustment switch Madj' may be a p-type (p-channel) transistor such as a p-type metal-oxide-semiconductor (PMOS) device having a first source-drain terminal coupled to the source terminal of cascode transistor Mcas1, a second source-drain terminal coupled to the source terminal of cascode transistor Mcas2, and a gate terminal configured to receive control voltage Vcon. Control voltage Vcon may be generated using one or more processor(s) in the electronic device (see, e.g., processor 88 described in connection with FIG. 4). Gain adjustment transistor Madj' may be deactivated (turned off) in the high gain mode by deasserted (driven high) signal Vcon. Since the source terminals of the cascode transistors are low impedance nodes, the parasitic capacitance of PMOS transistor Madj' has a minor impact on the signal transfer function in the high gain mode.

Control voltage Vcon may be asserted (driven low) to activate transistor Madj' in the low gain mode. Turning on transistor Madj' steers or diverts some of the current that otherwise would have flowed from the input transistors to the output terminals but instead through transistor Madj'. Diverting a fraction of the current away from the output terminals effectively decreases the gain of amplifier 51 and decreases its output power. Operated in this way, the input transistors M1 and M2 continues to operate at a high current density even during the low gain mode(s) and thus maintains the same noise characteristics as the high gain mode. P-type gain adjustment switch Madj' can have a fixed size or variable sizing (see, e.g., adjustable-sizing transistor of the type shown in FIG. 5).

Figure 8:
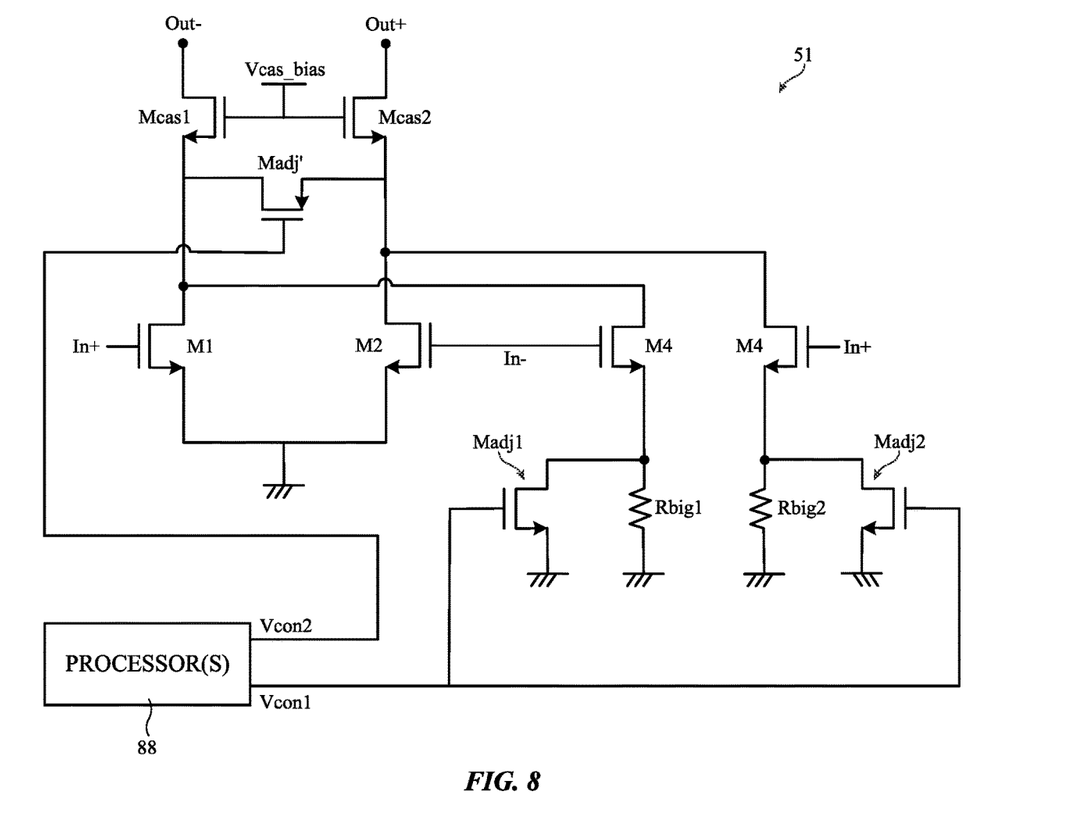
FIG. 8 is a circuit diagram of illustrative radio-frequency amplifier circuitry having n-type and p-type gain adjustment switches in accordance with some embodiments.

The example of FIG. 7 in which amplifier 51 has a p-type gain adjustment transistor coupled to the source terminals of the cascode transistors is merely illustrative. The embodiment of FIG. 7 is not mutually exclusive with the embodiments of FIGS. 4 and 6 and can thus be combined with the embodiments of FIGS. 4 and 6. FIG. 8 shows an example of radio-frequency amplifier 51 that combines the embodiment of FIG. 4 and the embodiment of FIG. 7. As shown in FIG. 8, input transistors M1 and M2 may be coupled to cascode transistors Mcas1 and Mcas2 and cross-coupled with capacitance neutralization transistors M3 and M4. P-type gain adjustment transistor Madj' may be coupled across the source terminals of the cascode transistors. N-type gain adjustment transistors Madj1 and Madj2 may be coupled (shunted) in parallel with source resistors Rbig1 and Rbig2, respectively.

In the example of FIG. 8, n-type gain adjustment transistors Madj1 and Madj2 have gate terminals configured to receive a first control voltage Vcon1 from processor 88, whereas p-type gain adjustment transistor Madj' has a gate terminal configured to receive a second control voltage Vcon2 from processor 88. Processor(s) 88 may, for example, represent one or more microprocessors, microcontrollers, digital signal processors, host processors, baseband processors, application processors, application specific integrated circuits, central processing units (CPUs), general purpose processors, and/or other types of processors. Processor 88 may sometimes be considered part of processor circuitry 18 shown in FIG. 1, processor 26 of the type shown in FIG. 2, or other types of processors.

Processor 88 may control voltages Vcon1 and Vcon2 in tandem or separately. For example, processor 88 may simultaneously assert voltages Vcon1 and Vcon2 (e.g., by driving Vcon1 high and driving Vcon2 low) when operating amplifier 51 in the lowest gain mode. As another example, processor 88 may assert only voltage Vcon1 while deasserting voltage Vcon2. As another example, processor 88 may assert only voltage Vcon2 while deasserting voltage Vcon1. Processor may deassert both voltages Vcon1 and Vcon2 (e.g., by driving Vcon1 low and driving Vcon2 high) when operating amplifier 51 in the high (maximum) gain mode.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A radio-frequency amplifier comprising:
   a first input transistor having a first source-drain terminal coupled to a ground power supply line, a second source-drain terminal coupled to a first amplifier output terminal, and a gate terminal configured to receive a radio-frequency signal;
   a second input transistor having a first source-drain terminal coupled to the ground power supply line, a second source-drain terminal coupled to a second amplifier output terminal, and a gate terminal configured to receive the radio-frequency signal;
   a first capacitance neutralization transistor directly coupled to the first and second input transistors;
   a second capacitance neutralization transistor directly coupled to the first and second input transistors; and
   at least one gain adjustment transistors coupled to the second source-drain terminal of the first capacitance neutralization transistor.

2. The radio-frequency amplifier of claim 1, wherein:
   the first capacitance neutralization transistor comprises a first source-drain terminal coupled to the second source-drain terminal of the first input transistor, a second source-drain terminal, and a gate terminal coupled to the gate terminal of the second input transistor; and the second capacitance neutralization transistor comprises a first source-drain terminal coupled to the second source-drain terminal of the second input transistor, a second source-drain terminal, and a gate terminal coupled to the gate terminal of the first input transistor.

3. The radio-frequency amplifier of claim 2, further comprising:

a first resistor having a first terminal coupled to the second source-drain terminal of the first capacitance neutralization transistor and having a second terminal coupled to the ground power supply line; and a second resistor having a first terminal coupled to the second source-drain terminal of the second capacitance neutralization transistor and having a second terminal coupled to the ground power supply line.

4. The radio-frequency amplifier of claim 3, wherein the first and second resistors each have a resistance value greater than ten thousand ohms.

5. The radio-frequency amplifier of claim 3, wherein the at least one gain adjustment transistor comprises:

a first gain adjustment transistor having a first source-drain terminal coupled to the second source-drain terminal of the first capacitance neutralization transistor, a second source-drain terminal coupled to the ground power supply line, and a gate terminal configured to receive a gain control voltage; and a second gain adjustment transistor having a first source-drain terminal coupled to the second source-drain terminal of the second capacitance neutralization transistor, a second source-drain terminal coupled to the ground power supply line, and a gate terminal configured to receive the gain control voltage.

6. The radio-frequency amplifier of claim 5, wherein the first and second gain adjustment transistors have variable sizing.

7. The radio-frequency amplifier of claim 5, wherein the first and second gain adjustment transistors comprise n-type transistors.

8. The radio-frequency amplifier of claim 2, further comprising:

a resistor having a first terminal coupled to the second source-drain terminals of the first and second capacitance neutralization transistors and having a second terminal coupled to the ground power supply line.

9. The radio-frequency amplifier of claim 3, wherein the first resistor has a resistance value greater than ten thousand ohms.

10. The radio-frequency amplifier of claim 9, wherein the at least one gain adjustment transistor comprises:

an n-type gain adjustment transistor having a first source-drain terminal coupled to the first terminal of the resistor, a second source-drain terminal coupled to the ground power supply line, and a gate terminal configured to receive a gain control voltage.

11. The radio-frequency amplifier of claim 10, wherein the n-type gain adjustment transistor has variable sizing.

12. The radio-frequency amplifier of claim 1, further comprising:

a first cascode transistor having a first source-drain terminal coupled to the second source-drain terminal of the first input transistor, a second source-drain terminal coupled to the first amplifier output terminal, and a gate terminal configured to receive a bias voltage; and a second cascode transistor having a first source-drain terminal coupled to the second source-drain terminal of the second input transistor, a second source-drain terminal coupled to the second amplifier output terminal, and a gate terminal configured to receive the bias voltage.

13. The radio-frequency amplifier of claim 12, further comprising:

an additional gain adjustment transistor having a first source-drain terminal coupled to the first source-drain terminal of the first cascode transistor, a second source-drain terminal coupled to the second source-drain terminal of the second cascode transistor, and a gate terminal configured to receive a gain control voltage.

14. The radio-frequency amplifier of claim 13, wherein the additional gain adjustment transistor comprises a p-type transistor.

15. The radio-frequency amplifier of claim 13, wherein the additional gain adjustment transistor has variable sizing.

16. A radio-frequency amplifier comprising:

a first input transistor having a first source-drain terminal coupled to a ground power supply line, a second source-drain terminal coupled to a first amplifier output terminal, and a gate terminal configured to receive a radio-frequency signal;

a second input transistor having a first source-drain terminal coupled to the ground power supply line, a second source-drain terminal coupled to a second amplifier output terminal, and a gate terminal configured to receive the radio-frequency signal;

a first cascode transistor having a first source-drain terminal coupled to the second source-drain terminal of the first input transistor, a second source-drain terminal coupled to the first amplifier output terminal, and a gate terminal configured to receive a bias voltage;

a second cascode transistor having a first source-drain terminal coupled to the second source-drain terminal of the second input transistor, a second source-drain terminal coupled to the second amplifier output terminal, and a gate terminal configured to receive the bias voltage; and a gain adjustment transistor having a first source-drain terminal coupled to the first source-drain terminal of the first cascode transistor, a second source-drain terminal coupled to the first source-drain terminal of the second cascode transistor, and a gate terminal configured to receive a gain control voltage, wherein the first and second input transistors have a first channel type, and wherein the gain adjustment transistor has a second channel type different than the first channel type.

17. The radio-frequency amplifier of claim 16, wherein the first and second input transistors comprise n-type transistors and wherein the gain adjustment transistor comprises a p-type transistor.

18. The radio-frequency amplifier of claim 16, wherein the gain adjustment transistor has variable sizing.

19. An electronic device comprising:

one or more processors configured to output transmit signals;

a transceiver configured to generate radio-frequency signals based on the transmit signals output from the one or more processors and configured to receive radio-frequency signals from an antenna; and a radio-frequency amplifier configured to amplify the radio-frequency signals generated by the transceiver or received at the transceiver, the radio-frequency amplifier having a first input transistor having a source terminal coupled to a ground power supply line, a drain terminal coupled to a first amplifier output terminal, and a gate terminal configured to receive the radio-frequency signals;

a second input transistor having a source terminal coupled to the ground power supply line, a drain terminal coupled to a second amplifier output terminal, and a gate terminal configured to receive the radio-frequency signals;

capacitance neutralization transistors that are cross-coupled with the first and second input transistors;

one or more resistors coupled in series with the capacitance neutralization transistors; and one or more gain adjustment transistors coupled in parallel with the one or more resistors.

20. The electronic device of claim 19, wherein the radio-frequency amplifier further comprises:

a first cascode transistor having a source terminal coupled to the drain terminal of the first input transistor, a drain terminal coupled to the first amplifier output terminal, and a gate terminal configured to receive a bias voltage;

a second cascode transistor having a source terminal coupled to the drain terminal of the second input transistor, a drain terminal coupled to the second amplifier output terminal, and a gate terminal configured to receive the bias voltage; and an additional gain adjustment transistor having a first source-drain terminal coupled to the source terminal of the first cascode transistor and having a second source-drain terminal coupled to the source terminal of the second cascode transistor.

21. The electronic device of claim 20, wherein the one or more gain adjustment transistors comprise one or more n-type transistors, and wherein the additional gain adjustment transistor comprises a p-type transistor.

* * * * *